United States Patent [19]
Itoh et al.

[11] Patent Number: 5,184,093
[45] Date of Patent: Feb. 2, 1993

[54] FREQUENCY SYNTHESIZER

[75] Inventors: Kenji Itoh; Akio Iida; Shuji Urasaki, all of Kanagawa, Japan

[73] Assignee: Mitsubishi Denki Kabushiki Kaisha, Japan

[21] Appl. No.: 840,937

[22] Filed: Feb. 25, 1992

[30] Foreign Application Priority Data

Mar. 8, 1991 [JP] Japan .................... 3-043515
Nov. 26, 1991 [JP] Japan .................... 3-310339

[51] Int. Cl.$^5$ .................................... H03L 7/00
[52] U.S. Cl. ............................... 331/25; 307/271; 328/14
[58] Field of Search ............... 331/2, 25; 307/271, 307/529; 328/14

[56] References Cited

U.S. PATENT DOCUMENTS

| | | | |
|---|---|---|---|
| 4,659,999 | 4/1987 | Motoyama et al. | 331/2 |
| 4,951,004 | 8/1990 | Sheffer et al. | 331/25 X |
| 4,965,533 | 10/1990 | Gilmore | 331/18 |
| 5,036,295 | 7/1991 | Kamitani | 331/10 |

FOREIGN PATENT DOCUMENTS 3-157018 7/1991 Japan .

OTHER PUBLICATIONS

Bramble, "Direct Digital Frequency Synthesis", Proc. 35th Ann. Freq. Control Symposium, May 1981, pp. 406–414.

Primary Examiner—Robert J. Pascal
Attorney, Agent, or Firm—Wolf, Greenfield & Sacks

[57] ABSTRACT

A frequency synthesizer, including a direct digital synthesizer (DDS) for providing wave amplitude data as a standard signal source, and a phase lock loop for comparing a branched synthesizer frequency with the standard signal source at a phase comparator. A frequency converter converts the output frequency of the DDS to a higher frequency and provides the resultant higher frequency to the phase comparator in the phase loop. A small loop dividing ratio is obtained by converting the low frequency of the DDS to a higher frequency. A spurious of the synthesizer output signal is reduced and provides a low power consumption apparatus.

17 Claims, 12 Drawing Sheets

FREQUENCY SYNTHESIZER

BACKGROUND OF THE INVENTION

The invention relates to a frequency synthesizer for providing low spurous output and low electrical power consumption.

FIG. 9 is a conventional construction of a frequency synthesizer disclosed in the Japanese laid-open publication No. 63-296522 or U.S. Pat. No. 4,965,533. The basic operation of the conventional phase locked loop frequency synthesizer using the Direct Digital Frequency Synthesizer (DDS) as a reference oscillator is disclosed in the paper, Albert L. Bramble, "Direct Digital Frequency Synthesis", Digest of Proc. 35th Ann. Freq. Control Symposium, May 1981, pp406~414.

In FIG. 9, 1 is a direct digital synthesizer (DSS). 2 is an output terminal of the direct digital synthesizer 1. 3 is a phase comparator. 4 is a loop filter. 5 is a voltage controlled oscillator (VCO). 6 is a coupler from where the output of the synthesizer frequency is branched. 7 is a frequency divider having dividing ratio N. 8 is a phase lock loop comprised of the phase comparator 3, the loop filter 4, the voltage controlled oscillator (VCO) 5, the coupler 6 and the frequency divider 7, 9 is an output terminal of the phase lock loop 8.

An operation of the conventional frequency synthesizer shown in FIG. 9 is explained hereinafter. In the conventional frequency synthesizer, a part of the output power (frequency $f_0$) of the VCO 5 is branched by the coupler 6. The branched frequency is divided by dividing ratio N in the frequency divider 7, and the divided frequency $f_0/N$ is outputted to the phase comparator 3. The phase of the output signal (frequency $f_0/N$) from the frequency divider 7 and the output signal (frequency $f_d$) from the direct digital synthesizer 1 are compared in the comparator 3. The output of the comparator 3 is applied to the VCO 5 through the loop filter 4 and controls the output frequency of the VCO 5. The phase lock loop 8 operates so that the frequency $f_0/N$ from the divider 7 and the frequency $f_d$ from the direct digital synthesizer 1 becomes equal. The output frequency $f_0$ of the frequency synthesizer is obtained in the following equation (1).

$$f_0 = N \cdot f_d \qquad (1)$$

FIG. 10 illustrates one embodiment of a direct digital synthesizer (DDS). In FIG. 10, 12 is an input terminal for frequency setting data. 2 is an output terminal. 10 is a clock oscillator. 13 is a memory for digitally storing amplitude data of sine waves each having a predetermined phase. 11 is a phase accumulator for generating a phase information signal in order to read amplitude data of the sine wave stored in the memory 13 during each period of the clock signal (frequency $f_{ck}$) in accordance with the frequency setting data (decimal number k). 14 is a digital to analog converter (D/A converter). 15 is a filter.

The operation of the direct digital synthesizer 1 is explained hereinafter. The output phase information signal from the phase accumulator 11 causes the memory 13 to output amplitude data of the sine waves (digital signal). The output amplitude data of the sine waves is converted into analog voltage data by the D/A converter 14. The analog data is applied to the filter 15 and undesired waves are eliminated. Assume that a word length of the phase accumulator 11 is b, then the output frequency $f_d$ of the direct digital synthesizer 1 is obtained in a equation (2).

$$f_d = k \cdot f_{ck}/2^b \qquad (2)$$

By substituting the equation (2) into the equation (1), the output frequency $f_0$ of the frequency synthesizer is obtained in equation (3).

$$f_0 = N \cdot k \cdot f_{ck}/2^b \qquad (3)$$

In the conventional frequency synthesizer, the output frequency $f_0$ can be changed for each channel interval $\Delta f_0$ obtained by the following equation (4) by changing the frequency setting data k.

$$\Delta f_0 = N \cdot f_{ck}/2^b \qquad (4)$$

In the DDS 1, the amplitude data of the sine wave are quantized and stored in the memory 13. The quantization of the signal produces a wave distortion according to the quantization roughness.

FIG. 11 illustrates an output spectrum generated in the DDS 1. In FIG. 11, the spurious signals generated by the quantization can be seen in the spectrum. If such a signal is applied to the phase lock loop 8 as a standard signal, the spurious signal is also included in the output signal of the frequency synthesizer. Assume that a spurious power ratio is $S_i$ (i=1, 2, 3, ...) which is the ratio of carrier signal and spurious signal at the output of the DDS 1, then a spurious power ratio $S_{oi}$ (i=1, 2, 3, ...) which is a ratio of carrier signal and spurious signal at the output of the frequency synthesizer is obtained in the following equation (5).

$$S_{oi} = N^2 \cdot |H(f_m)|^2 \cdot S_i \qquad (5)$$

Where, $$H(f_m) = G(f_m)/\{1 + G(f_m)\} \qquad (6)$$

$$G(f_m) = K_p \cdot K_v |F(f_m)/(j2\pi f_m)| \qquad (7)$$

$f_m$ is a offset frequency from the carrier frequency, $K_p$ is a sensitivity of the phase comparator 3, $K_v$ is a sensitivity of the VCO 5, $F(f_m)$ is a gain of the loop filter 4.

From the equation (5), it is easily understood that the output spurious signals of the frequency synthesizer decreases if a dividing ratio N of the divider 7 decreases or the absolute value of the H ($f_m$) decreases. Since the interval between the spurious and the carrier frequency is very narrow, it is difficult to eliminate the spurious signals generated in the frequency synthesizer. It is though that the only method for solving the above problem is to decrease the dividing ratio N.

There are many methods for decreasing the dividing ratio N.

A first method is to increase the frequency of the standard signal applied to the phase comparator 3, that is, the output frequency $f_d$ of the DDS 1. But, in order to obtain a high frequency signal as an output of the DDS 1, high speed devices such as ECL (Emitter Coupled Logic) devices must be used.

FIG. 12 illustrates the characteristics between consumption power and operation frequency of ECL and CMOS being used in the DDS. The ECL devices consume a large amount of electric power rather than CMOS (Complementary Metal Oxide Semiconductor) devices as shown in FIG. 12.

As described above, in the conventional frequency synthesizer, if the frequency of the standard signal increases for eliminating the spurious signals, then the consumption power of the DDS 1 increases.

A second method is to convert the output frequency of the DDS 5 to a higher frequency using converter means, instead of increasing the frequency of the DDS 5. The converted frequency signal is used as a standard signal and applied to the phase comparator 3.

FIG. 13 illustrates a conventional frequency synthesizer including a phase locked loop as a multiplier used for such conversion means described in the laid-open patent publication No. 64-24633/1989. In FIG. 13, 1a and 1b are direct digital synthesizers (DDS). 8 is a phase lock loop having the same function as that in FIG. 6. 18 is a filter. 26 is a multiplier using phase lock loop. 16 is a mixer for mixing the branched output of the frequency synthesizer and the output of the multiplier 26. 19 is a frequency converter comprised of the DDS 1b, the multiplier 26, the mixer 16 and the filter 18.

In FIG. 13, an output frequency of the DDS 1b is multiplied by the multiplier 26 having a phase lock loop in it. The output of the multiplier 26 is outputted to the mixer 16 and is mixed with the output of the VCO 5 (frequency $f_0$) to obtain a difference signal. A resultant output signal from the mixer 16 is applied to the filter 18 for eliminating the spurious signals. The output signal from the filter 18 is applied to the phase comparator 3 with the output from the DDS 1a to obtain a constant output frequency $f_0$ from the output terminal 9.

In the above construction, since the spurious signal at the output of the frequency converter 19 increases in proportion to the square of the multiplication number N of the multiplier 26 as shown in the equation (5), the output signal is almost the same as $S_{oi}$ in the frequency synthesizer of FIG. 9. Therefore, even if the dividing ratio of the phase lock loop, including the phase comparator 3, loop filter 4 and VCO 5, is equal to 1, the spurious signal at the output terminal 9 is not eliminated. That is, the frequency synthesizer shown in FIG. 13 is suitable for generating a comparatively low frequency signal for a narrow frequency interval, but it is not suitable for eliminating the spurious signal.

It is a primary object of the present invention to provide a frequency synthesizer having low spurious signal and low power consumption.

SUMMARY OF THE INVENTION

In one preferred embodiment of the present invention, a frequency converter is provided for converting an output frequency of a direct digital synthesizer to a higher frequency. The converted higher frequency serves as a standard signal source of the phase lock loop.

In another preferred embodiment of the present invention, a frequency converter is provided for converting an output frequency of a direct digital synthesizer to a lower frequency. The converted frequency is compared with the standard signal. The resultant signal is provided to the phase lock loop.

DETAILED DESCRIPTION OF THE PREFERRED EMBODIMENTS

Embodiment 1

Figure 1:
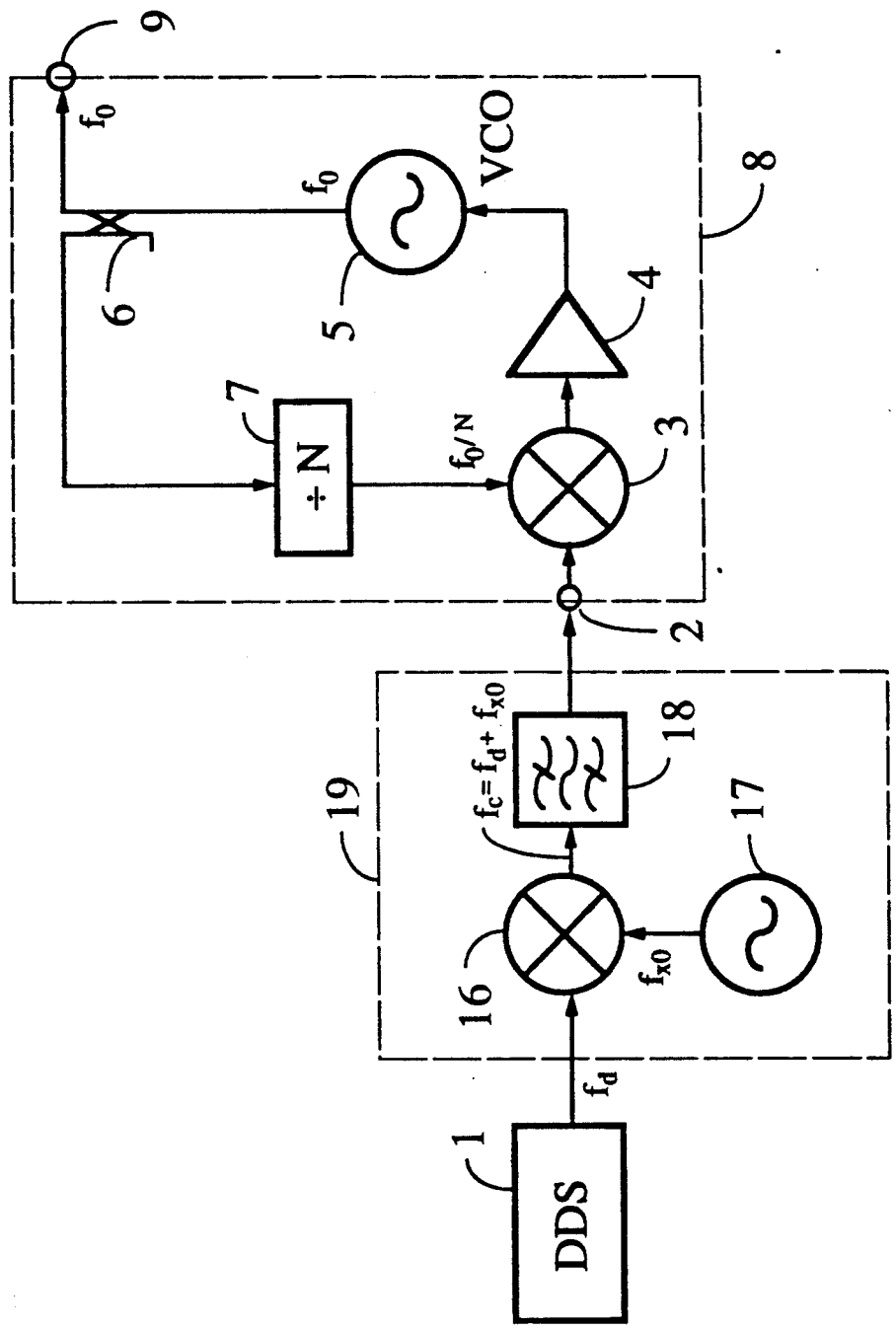
FIG. 1 illustrates a block diagram of a frequency synthesizer for a first embodiment of the present invention.

FIG. 1 illustrates a block diagram of a frequency synthesizer for a first embodiment of the present invention. In FIG. 1, 16 is a mixer, 17 is a local oscillator such as a crystal oscillator. 18 is a filter. 19 is a frequency converter comprised of mixer 16, local oscillator 17 and filter 18. The other elements of FIG. 1 are the same as that of the elements corresponding to the same numerals in FIG. 9.

The operation of the first embodiment of the present invention is explained hereinafter. In FIG. 1, DDS 1 generates a low frequency $f_d$ with low power consumption. The output of the DDS 1 is mixed with the output of the local oscillator 17 (frequency $f_{x0}$). The resultant output of the mixer 16 is applied to the filter 18 for eliminating the spurious signal of the local oscillator and any undesired signal such as an image signal. The output signal $f_c$ of the frequency converter 18 is obtained in an equation (8).

$$f_c = f_d + f_{x0} \tag{8}$$

The output frequency $f_0$ of the frequency synthesizer is obtained from the equations (1), (2) and the equation (8) as follows.

$$\begin{aligned} f_0 &= N \cdot f_c \\ &= N \cdot (f_d + f_{x0}) \\ &= N \cdot k \cdot f_{ck}/2^b + N \cdot f_{x0} \end{aligned} \tag{9}$$

From the equation (9), the dividing ratio N is obtained as follows.

$$N = f_0/(f_d + f_{x0}) \quad (10)$$

On the other hand, from the equation (1), the dividing ratio N is obtained as follows.

$$N = f_0/f_d \quad (11)$$

Figure 9:
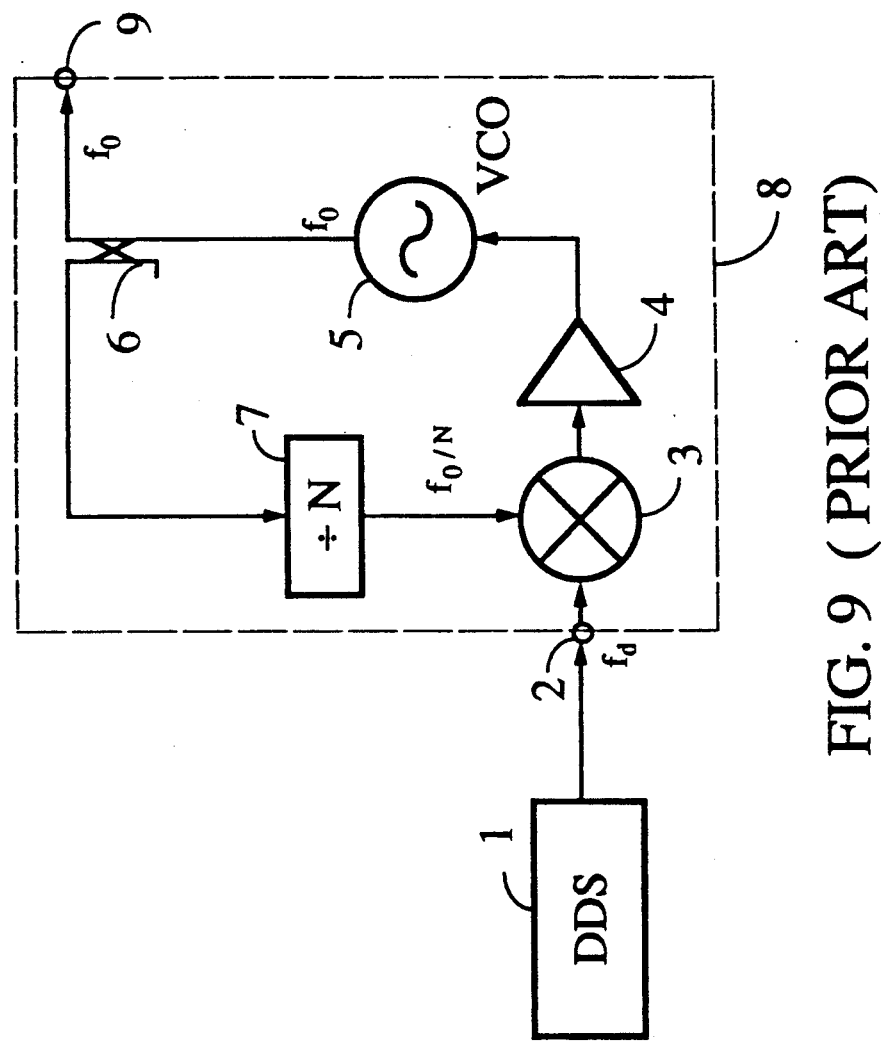
FIG. 9 illustrates a conventional type of a frequency synthesizer.

By comparing the equation (10) with the equation (11), it is easily understood that the dividing ratio N in the equation (10) of the present invention can be smaller than that in the equation (11) of the prior art in FIG. 9. In FIG. 1, since the amount of spurious signals at the output ($f_d$) of the DDS 1 is the same as that at the output ($f_c$) of the mixer 16, the output spurious signals from the mixer can be decreased to $f_d/(f_d + f_{x0})$. If the local frequency $f_{x0}$ is selected higher than the frequency of the DDS 1, then the output spurious signal is greatly decreased. According to the present invention a low dividing ratio N is obtained. Therefore, a low frequency DDS can be used and a low spurious frequency output can be obtained in the present invention.

In the first embodiment, the frequency can be changed for each step of $\Delta f_0$ ($\Delta f_0 = N \cdot f_{ck}/2^b$) obtained from the equation (9) in the same way as described in the prior art of FIG. 9.

Embodiment 2

Figure 2:
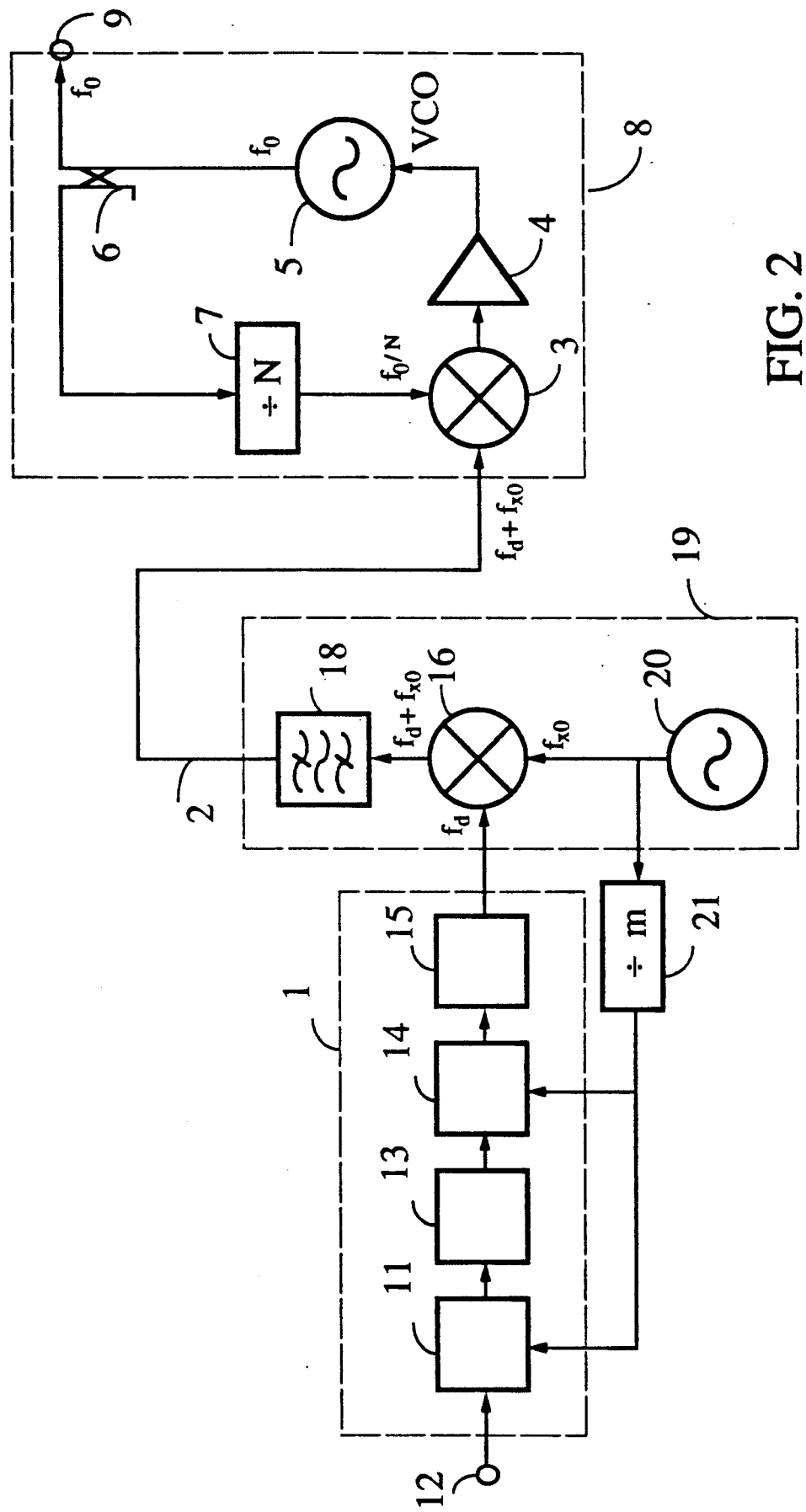
FIG. 2 illustrates a block diagram of a frequency synthesizer for a second embodiment of the present invention.

FIG. 2 illustrates a block diagram of a frequency synthesizer for the second embodiment of the present invention. The clock source in the DDS 1 and the local oscillator 17 are provided separately in FIG. 1. But in the second embodiment of the present invention, a common oscillation source is provided for DDS 1 and for the local oscillator. In FIG. 2, 20 is a common oscillator (frequency $f_{x0}$). 21 is a divider having a dividing ratio m. The other elements of FIG. 2 are the same as that of the elements corresponding to the same numerals in FIG. 1, FIG. 9 and FIG. 10.

In the frequency converter 19 of FIG. 2, the dividing ratio N is obtained as $N = f_0/(f_d + f_{x0})$ in the same way as described in the first embodiment. Therefore, a small sized DDS 1 can be used and low spurious output is obtained from the frequency converter 19 because of the small dividing ratio N.

In this second embodiment, a frequency interval is different from the first embodiment as follows. In the frequency synthesizer of FIG. 2, a clock frequency of the DDS 1 is supplied from the common oscillator 20. The required clock frequency is obtained by dividing the output frequency of the divider 21 as shown in a equation (12).

$$f_{ck} = f_{x0}/m \quad (12)$$

The output frequency $f_0$ of the frequency synthesizer is obtained by substituting $f_{ck}$ of the equation (12) into the equation (9).

$$f_0 = N \cdot k \cdot f_{x0}/(m \cdot 2^b) + N \cdot f_{x0} \quad (13)$$

From the equation (13), the frequency interval $\Delta f_0$ is obtained as follows shown in equation (14).

$$\Delta f_0 = N \cdot f_{x0}/(m \cdot 2^b) \quad (14)$$

From the equations (13) and (14), it is easily understood that the frequency $f_0$ is changed for each frequency interval $\Delta f_0$ by changing the frequency setting data k.

Embodiment 3

Figure 3:
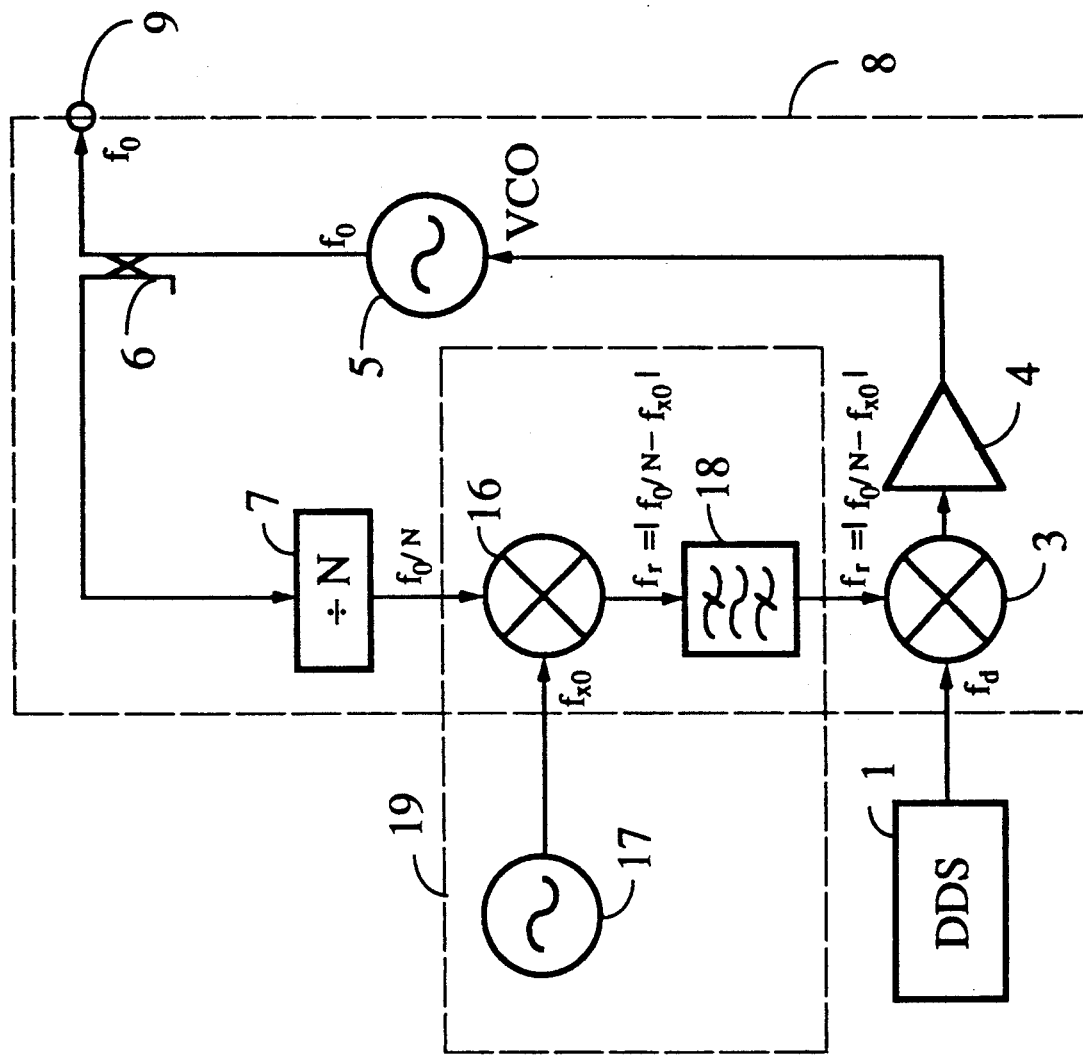
FIG. 3 illustrates a block diagram of a frequency synthesizer for a third embodiment of the present invention.

FIG. 3 illustrates a block diagram of a frequency synthesizer for a third embodiment of the present invention. The elements of FIG. 3 corresponds to the elements having the same numerals in FIG. 9.

In the third embodiment shown in FIG. 3, an output (frequency $f_0/N$) of the divider 7 is mixed with the output (frequency $f_{x0}$) of the local oscillator 17 in the mixer 16. The resultant output frequency (frequency $f_r$) obtained from the mixer 16 is applied to the filter 18 for eliminating the spurious content of the output signal.

The output frequency $f_r$ from the mixer 16 is obtained in the following equation (15).

$$f_r = |f_0/N - f_{x0}| \quad (15)$$

The output frequency (frequency $f_r$) of the frequency converter 19 is compared with the output (frequency $f_d$) of the DDS 1 in the phase comparator 3. The resultant output is applied to the VCO 5 as a control signal. The phase lock loop 8 operates so that the output frequency $f_r$ of the frequency converter 19 becomes equal to the output frequency $f_d$ of the DDS 1.

The output frequency $f_0$ of the frequency synthesizer is obtained from the equation (16)

$$f_d = f_r = |f_0/N - f_{x0}| \quad (16)$$

such as in an equation (17), $$f_0 = N \cdot |f_{x0} \pm f_d| \quad (17)$$

From the equation (17), dividing ratio N is obtained from the equation (17) as shown in an equation (18).

$$N = f_0/|f_{x0} \pm f_d| \quad (18)$$

As easily understood from the equation (18), the dividing ratio N can be decreased by using higher frequency $f_{x0}$ for the local oscillator 17 in the frequency converter 19. Therefore, a small sized DDS can be used and a low spurious output is obtained because of the small dividing ratio N.

In the third embodiment of the present invention, the clock frequency in the DDS 1 can be provided commonly from the local oscillator 17 in the frequency converter 19 in the same way as described in the second embodiment.

Embodiment 4

Figure 4:
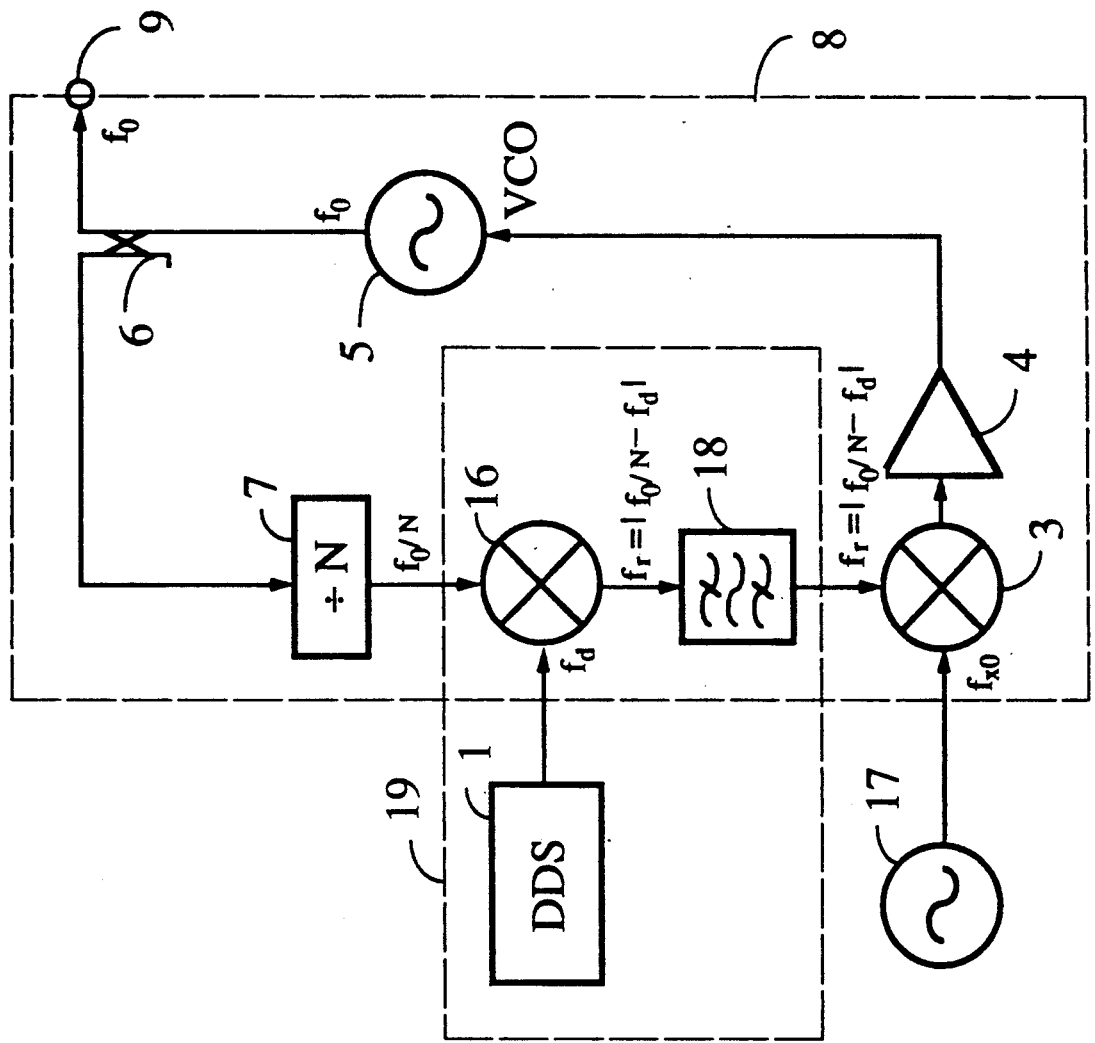
FIG. 4 illustrates a block diagram of a frequency synthesizer for a fourth embodiment of the present invention.

FIG. 4 illustrates a block diagram of a frequency synthesizer for a fourth embodiment of the present invention. The elements of FIG. 4 corresponds to the elements having the same numerals in FIG. 3.

The fourth embodiment differs from the third embodiment in that a DDS 1 is provided for a local oscillator in the frequency converter 19, and a fixed local oscillator 17 is provided for a standard signal source for the phase comparator 3.

As shown in FIG. 4, the output (frequency $f_0/N$) of the frequency divider 7 is mixed with the output (frequency $f_d$) of the DDS 1 in the mixer 16. The resultant output (frequency $f_d$) of the mixer 16 is applied to the filter 18 for eliminating spurious signals. The resultant output (frequency $f_r$) is obtained as the difference frequency of the two frequencies as shown in equation (19).

$$f_r = |f_0/N - f_d| \quad (19)$$

The output frequency $f_0$ and the dividing ratio N of the frequency synthesizer of the fourth embodiment are obtained in following equations.

$$f_0 = N \cdot |f_d \pm f_{x0}| \quad (20)$$

$$N = f_0/|f_d \pm f_{x0}| \quad (21)$$

As easily understood from the equation (21), the dividing ratio N can be decreased by using higher frequency $f_{x0}$ as same as described in the third embodiment. Therefore, a small sized DDS can be used and a low spurious output is obtained because of the small dividing ratio N.

Embodiment 5

Figure 5:
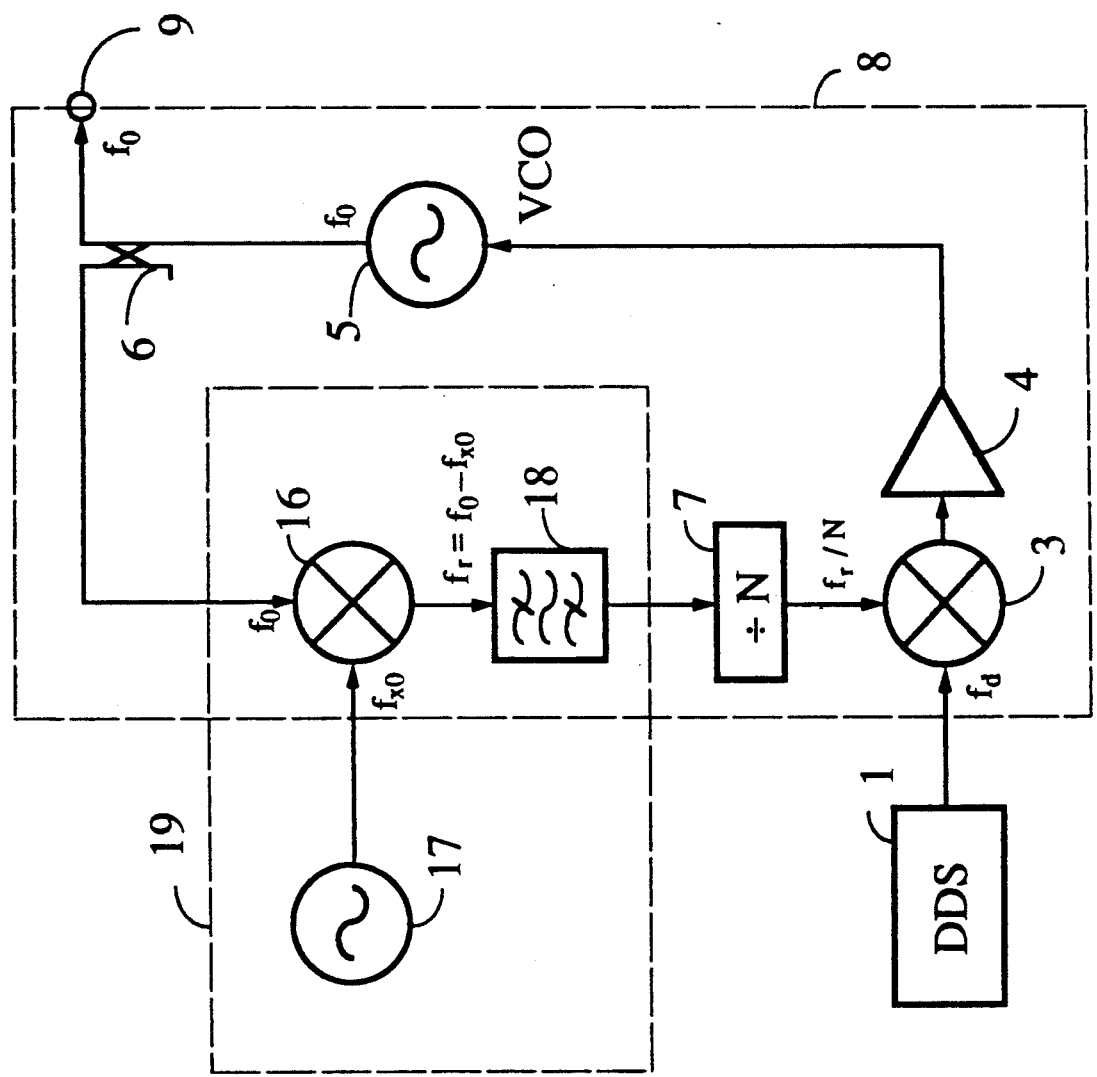
FIG. 5 illustrates a block diagram of a frequency synthesizer for a fifth embodiment of the present invention.

FIG. 5 illustrates a block diagram of a frequency synthesizer for a fifth embodiment of the present invention. The elements of FIG. 5 corresponds to the elements having the same numeral in FIG. 3.

The fifth embodiment differs from the third embodiment in that the divider 7 is located at the output of the filter 18 in the phase lock loop 8.

The branched output frequency $f_0$ of the VCO 5 is mixed with the output frequency $f_{x0}$ of the local oscillator 17 in the mixer 16 of the frequency converter 19. The resultant output frequency from the mixer 16 is obtained as follows.

$$f_r = (f_0 - f_{x0}) \quad (22)$$

The difference frequency is divided by N in the frequency divider 7. The divided frequency $f_r/N$ is applied to the phase comparator 3 together with the output frequency $f_d$ of the DDS 1.

The output frequency $f_0$ and the dividing ratio N of the frequency synthesizer of the fifth embodiment are obtained in the following equations.

$$f_0 = N \cdot f_d + f_{x0} \quad (23)$$

$$N = (f_0 - f_{x0})/f_d \quad (24)$$

As easily understood from the equation (24), the dividing ratio N can be decreased by using higher frequency $f_{x0}$ in the same way as described in the third embodiment. Therefore, a small sized DDS can be used and a low spurious output is obtained because of the small dividing ratio N in the same way as described in the above embodiments.

Embodiment 6

Figure 6:
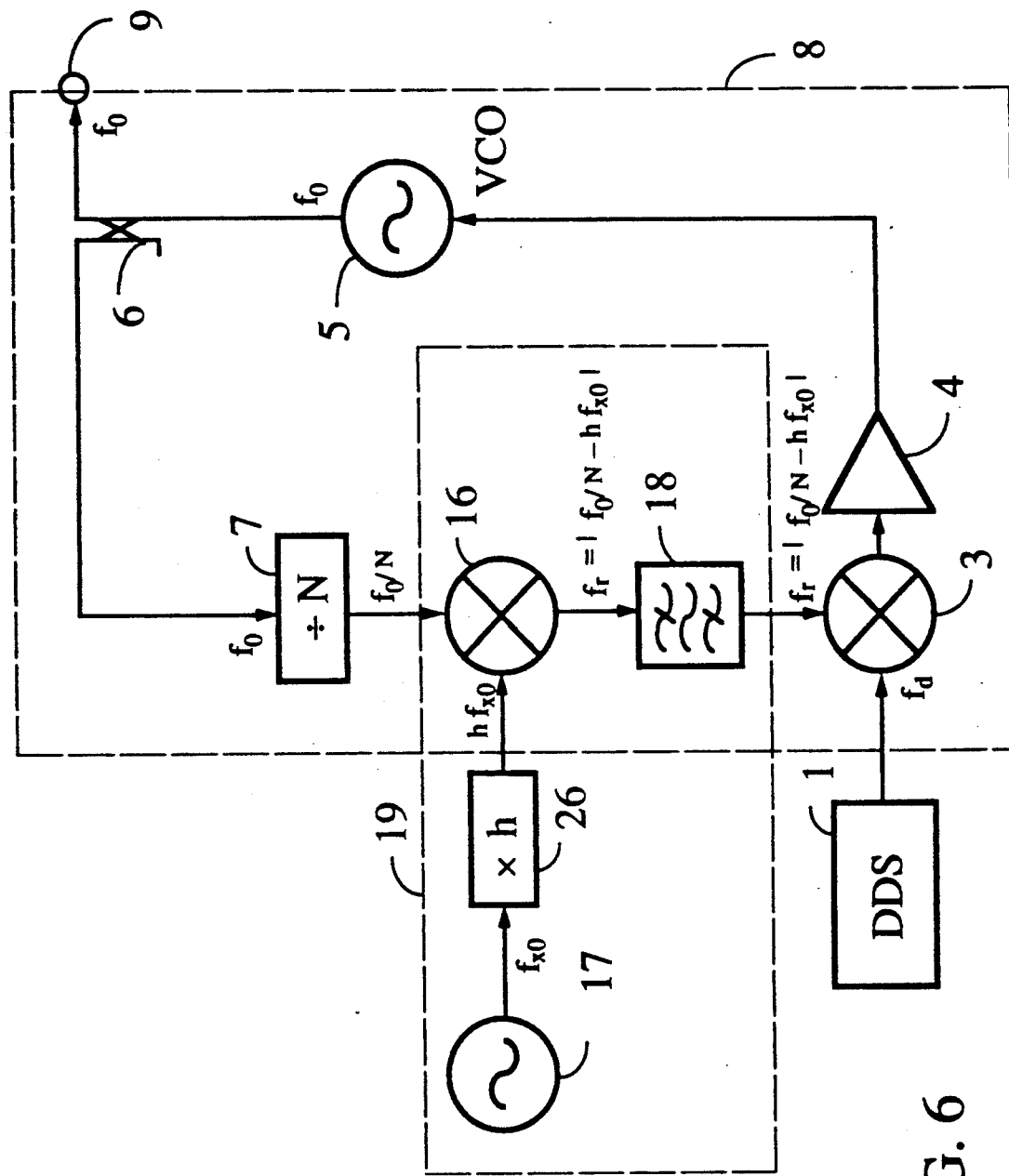
FIG. 6 illustrates a block. diagram of a frequency synthesizer for a sixth embodiment of the present invention.

FIG. 6 illustrates a block diagram of a frequency synthesizer for a sixth embodiment of the present invention. The elements of FIG. 6 corresponds to the elements having the same numerals in FIG. 3.

The sixth embodiment differs from the third embodiment in that an output frequency of the local oscillator 17 is multiplied by h in the multiplier 26.

The output frequency $h f_0$ of the multiplier 26 is mixed with the divided frequency $f_0/N$ from the divider 7 in the mixer 16. The resultant output frequency from the mixer 16 is obtained as follows.

$$f_r = |f_0/N - h \cdot f_{x0}| \quad (25)$$

The output frequency $f_r$ of the mixer 16 is applied to the filter 18 for eliminating spurious signals. The output frequency $f_r$ from the filter 18 is applied to the phase comparator 3 together with the output frequency $f_d$ of the DDS 1. The output frequency $f_0$ and the dividing ratio N of the frequency synthesizer of the fifth embodiment are obtained in following equations.

$$f_0 = N \cdot (h \cdot f_{x0} \pm f_d) \quad (26)$$

$$N = f_0/(h \cdot f_{x0} \pm f_d) \quad (27)$$

As easily understood from the equation (27), the dividing ratio N can be decreased by using higher frequency $f_{x0}$ as same as described in the third embodiment. Therefore, a small sized DDS can be used and a low spurious output is obtained because of the small dividing ratio N.

Embodiment 7

Figure 7:
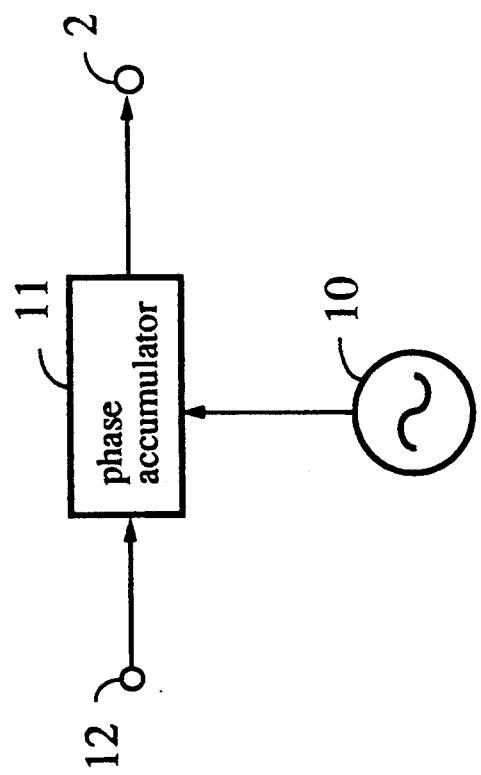
FIG. 7 illustrates another type of a direct digital synthesizer comprised of a clock generator and a phase accumulator.
Figure 10:
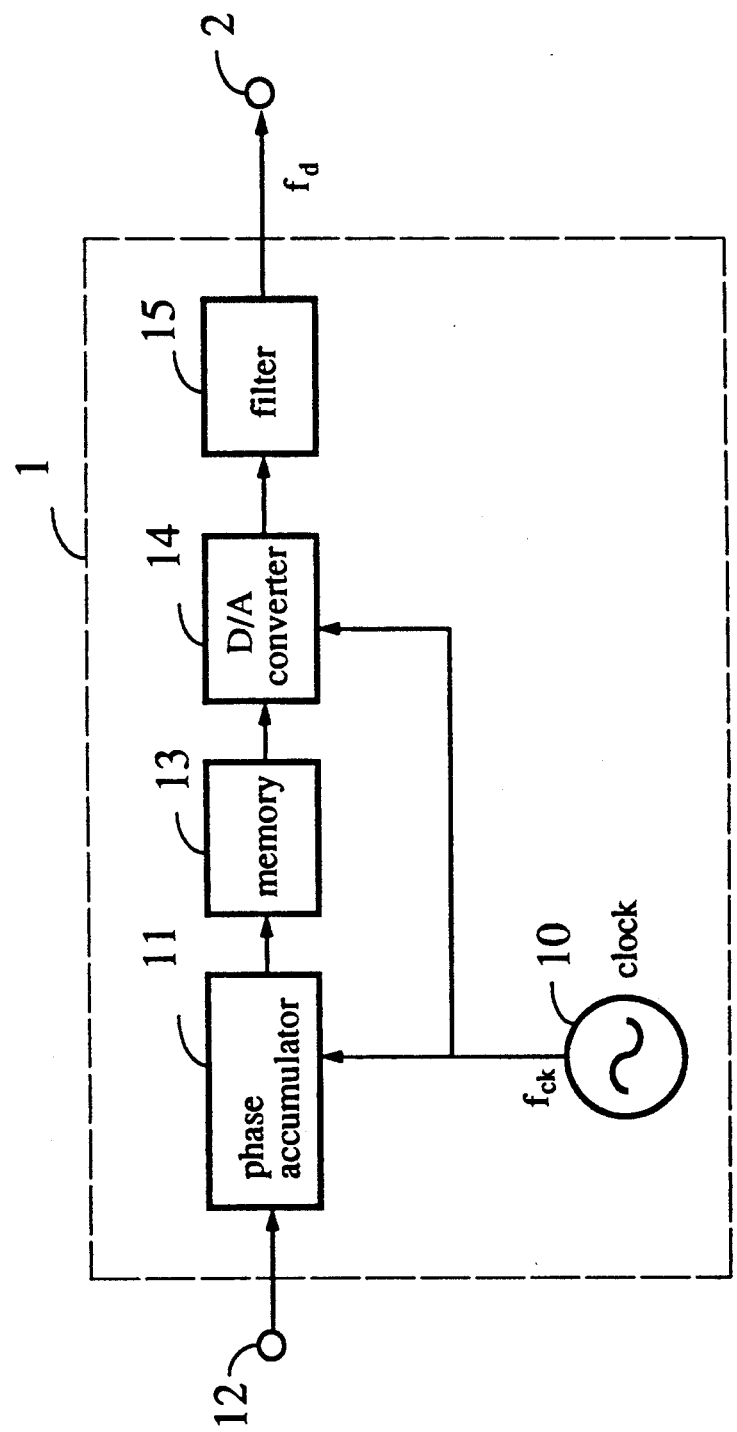
FIG. 10 illustrates one type of direct digital synthesizer.
Figure 11:
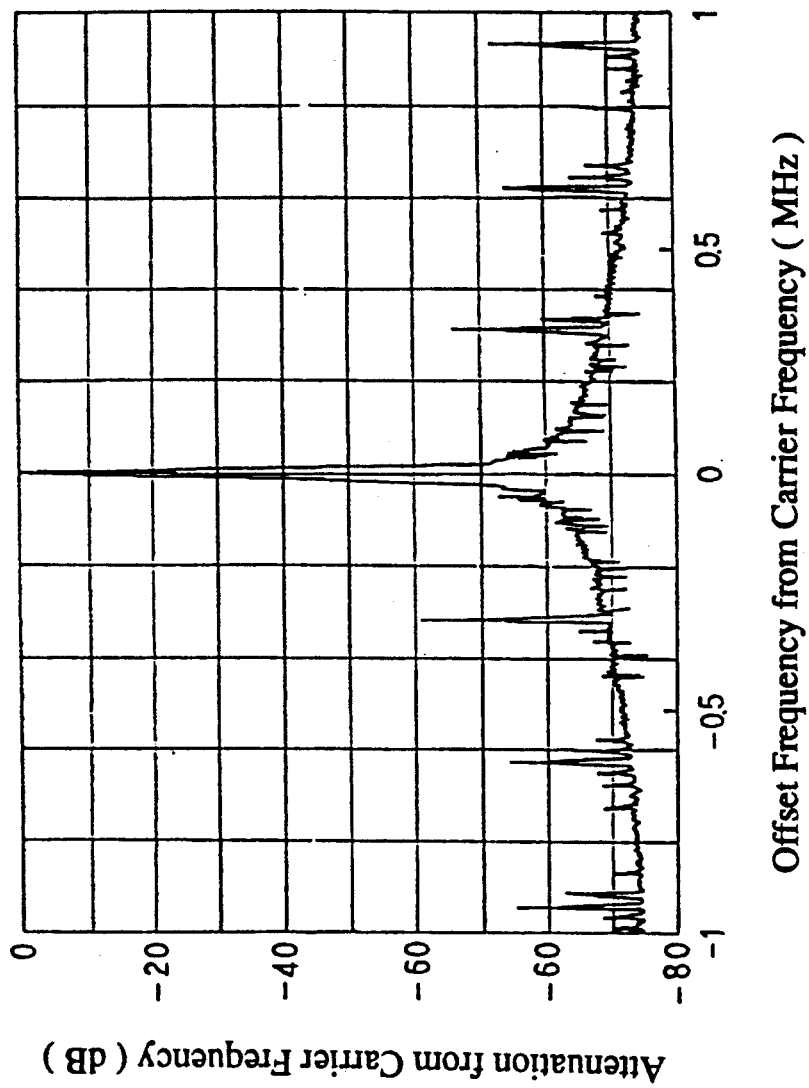
FIG. 11 illustrates an output spectrum generated from the DDS.
Figure 12:
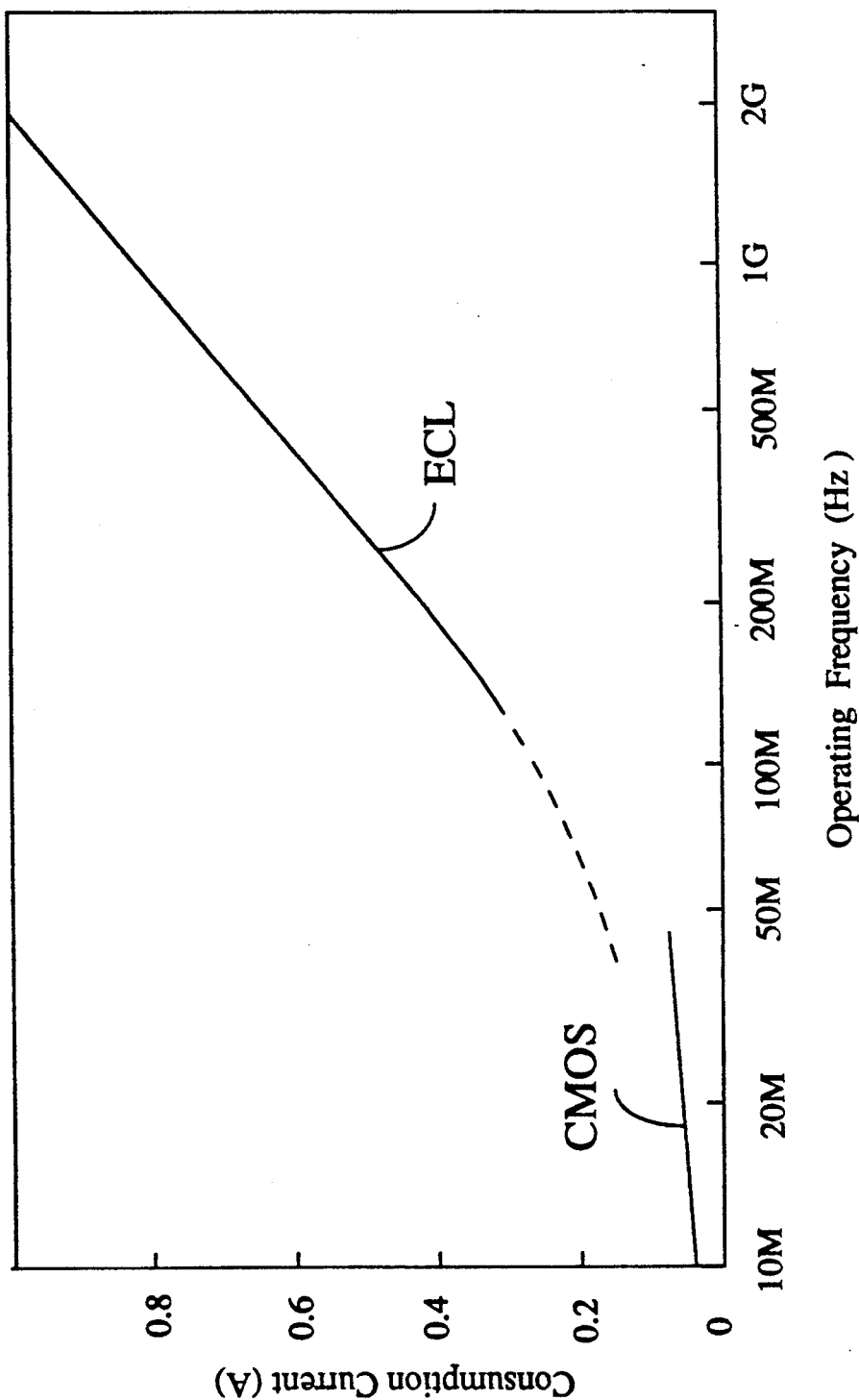
FIG. 12 illustrates the characteristics between consumption power and operation frequency of devices being used in the DDS.
Figure 13:
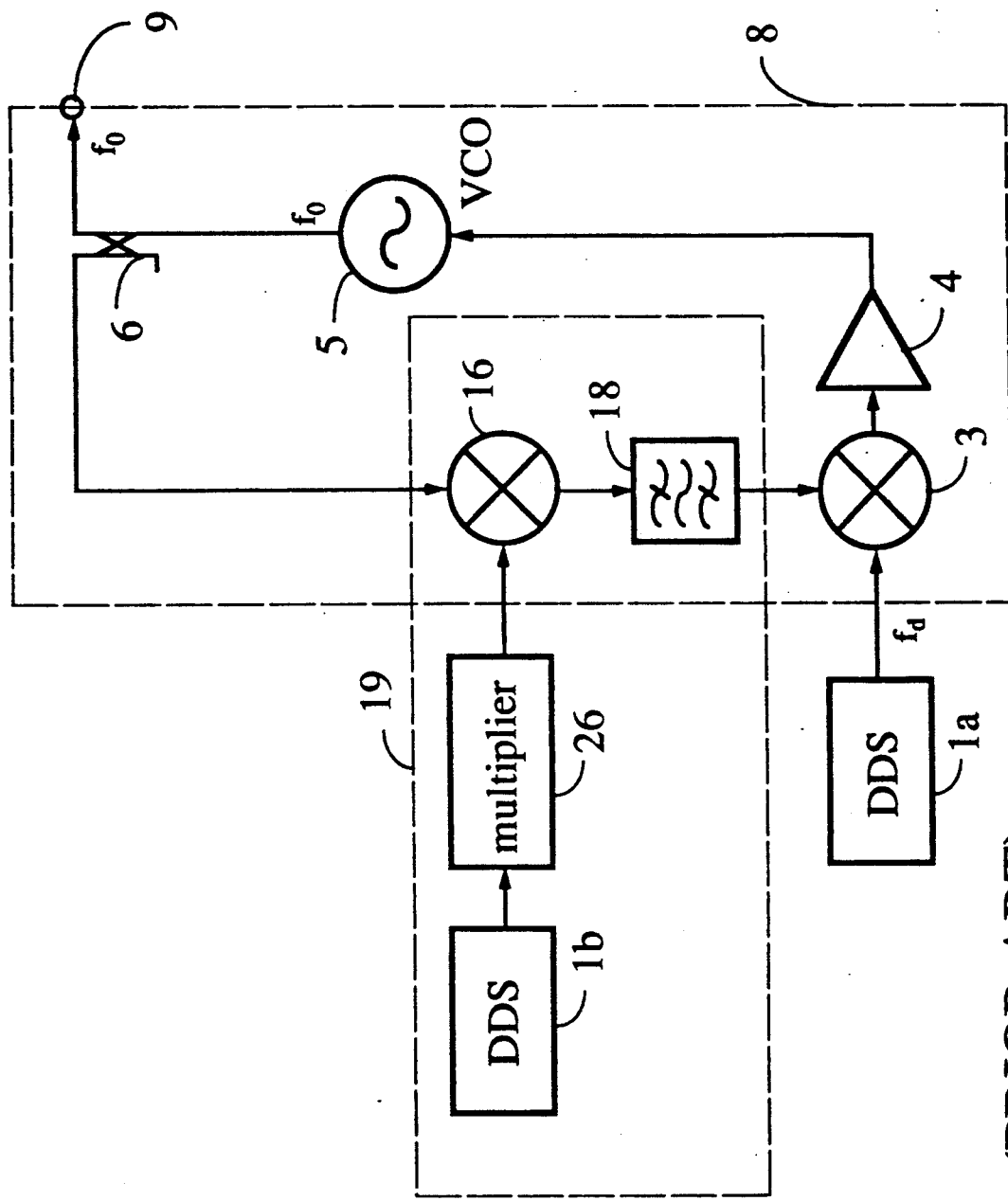
FIG. 13 illustrates a conventional frequency synthesizer.

In the above embodiments, DDS 1 is comprised of the clock 10, the phase accumulator 11, the memory 13 and the D/A converter 14 as illustrated in FIG. 10. DDS 1 may include a clock and a phase accumulator as disclosed in the book, IEEE, 42nd Annual Frequency Control Symposium Digest, 1988, pp352-pp356 as shown in FIG. 7. FIG. 7 illustrates a prior art DDS which comprises a clock oscillator 10 and a phase accumulator 11. The frequency synthesizer can obtain the same effect using the above DDS of FIG. 7 instead of the DDS illustrated in FIG. 10.

Embodiment 8

Figure 8:
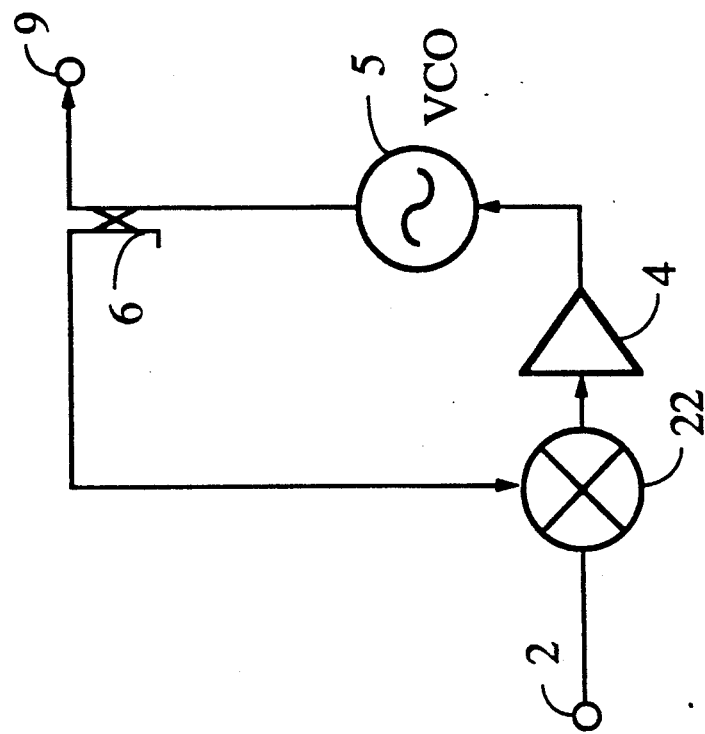
FIG. 8 illustrates another type of a sampling phase detector.

In the above embodiments, the phase lock loop includes divider 7 in its closed circuit. The frequency synthesizer can obtain the same effect using the sampling phase detector 22 of FIG. 8 instead of the divider 7. FIG. 8 illustrates a sampling phase detector 22.

Embodiment 9

In the above embodiments, an analog phase lock loop is used for the phase lock loop. The frequency synthesizer can obtain the same effect using a digital phase lock loop, where the phase comparator 3 and the loop filter 4 are comprised of digital arithmetic circuits.

Embodiment 10

In the above embodiments, each element in the figures corresponds to a separated block having a respective function. But, these elements may be formed on one semiconductor substrate such as Si or GaAs or on a plurality of semiconductor substrates.

What is claimed is:

1. A frequency synthesizer, including a direct digital synthesizer (DDS) for providing wave amplitude data as a standard signal source, and a phase lock loop for comparing a branched synthesizer frequency with the standard signal source at a phase comparator, comprising:

a frequency converter for converting the output frequency of the DDS to a higher frequency and for providing the resultant higher frequency to the phase comparator in the phase lock loop.

2. The frequency synthesizer according to claim 1, wherein said frequency converter is comprised of a local oscillator and a mixer for mixing an output from the DDS with an output from the local oscillator to obtain a higher differential frequency, and said phase lock loop includes a divider for providing a divided synthesizer frequency to the phase comparator.

3. The frequency synthesizer according to claim 2, wherein said local oscillator provides a common clock to the DDS as well as the mixers in the frequency converter.

4. A frequency synthesizer, including a direct digital synthesizer (DDS) for providing wave amplitude data as a standard signal source, and a phase lock loop for comparing a mixed signal generated from a branched synthesizer frequency with the standard signal source at a phase comparator, comprising:
a frequency converter for mixing the branched synthesizer frequency with a local oscillator frequency to generate a mixed lower frequency and for providing the resultant mixed lower frequency to the phase comparator in the phase loop.

5. The frequency synthesizer according to claim 4, wherein said frequency converter comprises a local oscillator and a mixer for mixing the branched synthesizer frequency with an output from the local oscillator to obtain a mixed lower frequency, and said phase lock loop includes a divider for providing a divided synthesizer frequency to the mixer in the frequency converter.

6. The frequency synthesizer according to claim 4, wherein said frequency converter comprises a local oscillator and a mixer for mixing the branched synthesizer frequency with an output from the local oscillator to obtain a lower mixed frequency, and said phase lock loop includes a divider for providing a divided low frequency generated from the output of the frequency converter to the phase comparator.

7. The frequency synthesizer according to claim 4, wherein said phase lock loop includes a divider for providing a divided synthesizer frequency to the mixer in the frequency converter, and said frequency converter comprises a local oscillator, a multiplier for multiplying an output frequency of the local oscillator and a mixer for mixing the output frequency from the divider with an output frequency from the multiplier to obtain a lower mixed frequency.

8. A frequency synthesizer, including a phase lock loop for comparing a branched synthesizer frequency with a standard signal source comprised of a local oscillator at a phase comparator, comprising:
a divider for providing a divided synthesizer frequency to the frequency converter in the phase lock loop;
a frequency converter for mixing the frequency from the divider with an output frequency of DDS to generate a lower mixed frequency and for providing the resultant lower mixed frequency to the phase comparator in the phase loop.

9. The frequency synthesizer according to claim 1, wherein said DDS comprises a clock generator and a phase accumulator for generating a rectangular wave.

10. The frequency synthesizer according to claim 1, wherein said phase lock loop comprises a sampling phase detector.

11. The frequency synthesizer according to claim 1, wherein said phase lock loop comprises a digital phase lock loop where the phase comparator and the loop filter include digital arithmetic circuits.

12. The frequency synthesizer according to claim 4, wherein said DDS comprises a clock generator and a phase accumulator for generating a rectangular wave.

13. The frequency synthesizer according to claim 4, wherein said phase lock loop comprises a sampling phase detector.

14. The frequency synthesizer according to claim 4, wherein said phase lock loop comprises a digital phase lock loop where the phase comparator and the loop filter include digital arithmetic circuits.

15. The frequency synthesizer according to claim 8, wherein said DDS comprises a clock generator and a phase accumulator for generating a rectangular wave.

16. The frequency synthesizer according to claim 8, wherein said phase lock loop comprises a sampling phase detector.

17. The frequency synthesizer according to claim 8, wherein said phase lock loop comprises a digital phase lock loop where the phase comparator and the loop filter include digital arithmetic circuits.

* * * * *